(12) United States Patent
Awad et al.

(10) Patent No.: US 6,855,646 B2
(45) Date of Patent: Feb. 15, 2005

(54) PLASMA POLYMERIZED ELECTRON BEAM RESIST

(75) Inventors: Yousef Awad, Sherbrooke (CA); Éric Lavallée, Rock Forest (CA); Jacques Beauvais, Sherbrooke (CA); Dominique Drouin, Deauville (CA)

(73) Assignee: Quantiscript Inc., Quebec (CA)

( * ) Notice: Subject to any disclaimer, the term of this patent is extended or adjusted under 35 U.S.C. 154(b) by 12 days.

(21) Appl. No.: 10/131,030

(22) Filed: Apr. 25, 2002

(65) Prior Publication Data

US 2003/0203648 A1 Oct. 30, 2003

(30) Foreign Application Priority Data

Apr. 9, 2002  (CA) ............................................ 2381128

(51) Int. Cl.[7] ....................... H01L 21/31; H01L 21/311; H01L 21/469
(52) U.S. Cl. ....................... 438/780; 438/670; 438/712; 438/714; 438/720; 438/738; 438/948; 438/950
(58) Field of Search ................................. 438/780, 670, 438/712, 714, 720, 738, 950, 694, 948

(56) References Cited

U.S. PATENT DOCUMENTS

| | | | |
|---|---|---|---|
| 4,307,178 A | | 12/1981 | Kaplan et al. |
| 4,382,985 A | | 5/1983 | Hattori et al. |
| 4,421,842 A | | 12/1983 | Hattori et al. |
| 4,421,843 A | * | 12/1983 | Hattori et al. ............... 430/322 |
| 4,500,628 A | | 2/1985 | Taylor |
| 4,560,641 A | * | 12/1985 | Kokaku et al. ............. 430/312 |
| 4,591,547 A | | 5/1986 | Brownell |
| 4,657,844 A | | 4/1987 | Shu et al. |
| 4,842,989 A | * | 6/1989 | Taniguchi et al. .......... 430/296 |
| 4,938,995 A | * | 7/1990 | Giordano et al. ........... 427/490 |
| 4,946,903 A | | 8/1990 | Gardella, Jr. et al. |
| 5,266,309 A | | 11/1993 | Gardella, Jr. et al. |
| 6,051,659 A | * | 4/2000 | Merritt et al. ............... 525/354 |

FOREIGN PATENT DOCUMENTS

| | | |
|---|---|---|
| GB | 1487936 A | 10/1977 |
| JP | 58005734 A2 | 1/1983 |

OTHER PUBLICATIONS

R. Kumar et al.; Solid State Technology 19 (10) ; Oct. 1976, pp. 54–59.

S. Morita et al.; J. Appl. Phys. 51 (7), Jul. 1980, pp. 3938–3941.

(List continued on next page.)

*Primary Examiner*—Matthew Smith
*Assistant Examiner*—Igwe U. Anya
(74) *Attorney, Agent, or Firm*—Birch, Stewart, Kolasch & Birch, LLP

(57) ABSTRACT

A process for producing a pattern of negative electron beam resist comprises: depositing a layer of plasma polymerized fluoropolymer on a face of a substrate, the plasma polymerized fluoropolymer forming the negative electron beam resist; producing an electron beam; moving the electron beam on the layer of plasma polymerized fluoropolymer to define the pattern, the layer then having exposed fluoropolymer areas defining the pattern and unexposed fluoropolymer areas; and removing the unexposed fluoropolymer areas to leave only the pattern on the face of the substrate. According to an alternative, the process comprises: depositing the layer of negative electron beam resist on a face of a substrate; producing an electron beam; moving the electron beam on the layer of negative electron beam resist to define the pattern, the layer then having exposed resist areas defining the pattern and unexposed resist areas; treating the patterned layer with a base solution to decrease a dry etch resistance of the unexposed resist areas; and dry etching the unexposed resist areas to leave only the pattern on the face of the substrate.

29 Claims, 3 Drawing Sheets

OTHER PUBLICATIONS

H. Hiraoka et al.; J. Vac. Sci. Technol., 19 (4), Nov./Dec. 1981, pp. 1132–1135.

R. D'Agostino et al.; J. Appl. Phys. 61 (8), Apr. 15, 1987, pp. 2754–2762.

M. Strobel et al.; Journal of Polymer Science, Part A, vol. 25, 1987, pp. 1295–1307.

M. Hori et al.; J. Electrochem. Soc., 134 (3), 1987, pp. 707–711.

F.O. Fong et al.; J. Vac. Sci. Technol. B 6 (1), Jan./Feb. 1998, pp. 375–378.

Y. Kagami et al.; J. App. Phys. 68 (2), Jul. 15, 1990, pp. 610–616.

S. Morita et al.; Proceeding of the $3^{rd}$ International Conference on Properties and Applications of Dielectric Materials, Jul. 8–12, 1991, Tokyo, Japan, pp. 635–638.

Y. Hikosaka et al.; Jpn. J. Appl. Phys., vol. 32 Part 1, No. 6B Jun. 1993, pp. 3040–3044.

K. Senda et al.; J. Appl. Phys. 74 (10), Nov. 15, 1993, pp. 6425–6426.

S. Gosavi et al.; Jpn. J. Appl. Phys. vol. 34, Part 1 No. 2A, Feb. 1995, pp. 630–635.

Frank F. Shi, Surface and Coatings Technology 82, 1996, pp. 1–15.

S. Babin et al.; J. Vac. Sci. Technol. B 14 (6), Nov./Dec. 1996, pp. 3860–3863.

A. Vanhulsel et al.; J. Vac. Sci. Technol. A 17 (4), Jul./Aug. 1999, pp. 2378–2383.

Y. Matsumoto et al.; Sensors and Actuators, 83 (2000), pp. 179–185.

C.E. Moffitt et al.; Applied Surface Science, 161, 2000, pp. 481–496.

V. Foglietti et al.; Microelectronic Engineering, 57–58, 2001, pp. 807–811.

R. D'Agostino et al., J. Appl. Phys. 54 (3), Mar. 1983, pp. 1284–1288.

N. Amoyt et al.; IEEE Transaction on Electrical Insulation, vol. 27, No. 6, Dec. 1992, pp. 1101–1107.

S.W. Pang et al.; J. Vac. Sci. Technol. B8 (6), Nov./Dec. 1990, pp. 1980–1984.

D. Seeger et al.; J. Vac. Sci. Technol. B 10 (6), Nov./Dec. 1992, pp. 2620–2627.

H.W. Koops et al.; Microelectronic Engineering 30, 1996, pp. 539–542.

A. Schmidt et al.; Microelectronic Engineering 35, 1997, pp. 129–132.

O. Joubert et al.; Microelectronic Engineering 30, 1996, pp. 275–278.

S. Imamura et al.; Journal of Applied Polymer Science, vol. 27, 1982, pp. 937–949.

C.E. Moffitt et al.; Applied Surface Science, vol. 161, 2000, pp. 481–496.

R. d'Agostino et al. Mechanisms of etching and polymerization in radio frequency discharges of $CF_4$–$H_2$, $CF_4$–$C_2F_4$, $C_2F_6$–$H_2$, $C_3F_8$–$H_2$, J. Appl. Phys. 54 (3), Mar. 1983.

* cited by examiner

PLASMA POLYMERIZED ELECTRON BEAM RESIST

FIELD OF THE INVENTION

The present invention relates to a process for producing a pattern in a layer of negative electron beam resist.

BACKGROUND OF THE INVENTION

There have been various attempts towards the development of high-sensitivity electron beam resists and improvements thereof for microelectronics applications. Considerable work has been directed to the synthesis of electron beam resist by wet chemical methods. Resist based lithography processes are very frequently involved in high resolution lithography techniques, and poly (methyl methacrylate) (PMMA) is one of the polymers most frequently used as a resist for electron beam lithography applications. This type of lithographic process suffers from many limitations, which can extremely constrain the fabrication of sub 100 nm devices. These limitations include resolution limits imposed by the nonuniformity of spin-coated resists, specially when the size of the workpiece is large or has a surface morphology resulting from previous fabrication steps. Resists must have a uniform thickness over the region used for patterning by electron beam lithography. Particularly, radial thickness variation is often associated with the application of resist by spinning.

Among other resists developed to increase sensitivity to electron beam and resolution, chemically amplified resists are one of the predominant types. A major disadvantage of chemically amplified resists is that they are very sensitive to the process conditions (D. Seeger, R. Viswanathan, C. Blair and J. Gelome, "*Single Layer Chemically Amplified Resist Processes for Device Fabrication by X-ray Lithography*", *J. Vac. Sci. Technol.* (1992), B10, pp. 2620–2627). Environmental factors such as airborne amines, time in vacuum system, and time to hydrate as well as extremely tight bake cycle tolerance can strongly affect the resist performance. Furthermore, controllable resist thickness and uniformity for multi-level processing in 3-D (three-dimensional) structure is extremely difficult to achieve using conventional wet resists.

Due to the various disadvantages caused by wet processing methods, dry resist processing has attracted considerable attention in recent years. Dry resist is a desirable alternative to wet processing resist, because it can be processed at ambient temperature; pinhole free film, good adhesion, uniform and ultrathin film deposition are other advantages. Many studies have focused on using plasma deposition to apply electron beam resist on a substrate (see for example: Morita S., Tamano J., Hattori S., et al. "*Plasma Polymerized Methyl Methacrylate as an Electron-Beam Resist*", *J. Appl. Phys.* 51 (7): July 1980, pp. 3938–3941; F. O. Fong, H. C. Kuo, J. C. Wolfe and J. N. Randall, "*Plasma Polymerized Styrene; A Negative Resist*" *J. Vac. Sci. Technol.*, B 6(1), Dec. 31, 1988, pp. 357–378; Shinzo Morita, Tsuyoshi Naganawa, Jong-Teak Kim, D. C. Lee, and Georgy K. Vinogradov, "*Functional Plasma Polymerized Thin Films Prepared by a New Type of Reactor*" *Proceeding of the 3$^{rd}$ International Conference on Properties and Applications of Dielectric Materials*, July 1991, Tokyo, Japan; and S. Gosavi, S. A. Gangal, B. A. Kuruvilla, et al. "*Plasma-Polymerized Chlorinated α-Methylstyrene (PP-C-α-MS)—A Performance Negative Electron Resist*" *Jpn. J. Appl. Phys.* 134 (2A), February 1995, pp. 630–635). Other studies used sublimation or thermal evaporation to apply electron beam resists on a substrate (see for example: V. Foglietti, E. Cianci, G. Giannini, "*Progress Toward the Fabrication of Scanning Near Field Optical Probe: Pattern Definition by Electron Beam Lightography*" *Microelectronic Engineering* 57–58, September 2001, pp. 807–811). Styrene and its derivatives have shown promising results as electron beam resist (S. Imamura, T. Tamamura, K. Harada and S. Sugawara: *J. Appl. Polm. Sci.* 27 (1982) 937). Many studies showed improvements in the resolution of the styrene, but the sensitivity is still poor (see for example: F. O. Fong, H. C. Kuo, J. C. Wolfe and J. N. Randall, "*Plasma-Polymerized Styrene; A Negative Resist*" *J. Vac. Sci. Technol.*, B 6(1), Dec. 31, 1988, pp. 375–378; Shinzo Morita, Tsuyoshi Naganawa, Jong-Teak Kim, D. C. Lee, and Georgy K. Vinogradov, "*Functional Plasma Polymerized Thin Films Prepared by a New Type of Reactor*", *Proceeding of the 3$^{rd}$ International Conference on Properties and Applications of Dielectric Materials*, July 1991, Tokyo, Japan). A high performance negative electron resist using plasma-polymerized chlorinated α-Methylstyrene (PP-C-α-MS) has been reported (S. Gosavi, S. A. Gangal, B. A. Kuruvilla, et al. *Jpn. J. Appl. Phys.* 134 (2A) February 1995, pp. 630–635). In this study, even the sensitivity is high but the resolution is very poor, and the process requires wet developing of the resist that resulted in undercut.

Plasma polymerized fluoropolymers have been used for various applications other than electron beam resist. As an example, a fluoropolymer thin film deposited by plasma-enhanced chemical vapor deposition (PCVD) has been used as interlayer insulation (U.S. Pat. No. 4,591,547 granted to Brownell in May 1986). Another study used a combination of $CF_4$ and $CH_4$ to deposit a fluorocarbon film for coating (see A. Vanhulsel, E. Dekempeneer, and J. Smeets, "*Plasma Polymerization of Fluorine Alloyed Amorphous Carbon Coatings*", *J. Vac. Sci. Technol.* A 17 (4), July/August 1999, pp. 2378–2383).

Different gases have been used to produce plasma polymerized fluoropolymer thin films. One instance is an article entitled "*Mechanisms of Etching and Polymerization in Radiofrequency Discharges of $CF_4$—$H_2$, $CF_4$—$C_2F_4$, $C_2F_6$—$H_2$, $C_3F_8$—$H_2$*", reported by R. d'Agostino, F. Cramarossa, V. Colaprico, and R. d'Ettole through the *American Institute of Physics* in *J. Appl. Phys.* 54(3), pp 1284–1288, March 1983. This paper reports some results obtained during the deposition of fluorocarbon films over Si substrates uncoupled from ground in RF plasmas fed with $CF_4$—$H_2$, $C_2F_6$—$H_2$, $C_3F_8$—$H_2$ and $CF_4$—$C_2F_4$ mixtures. Yet another instance is an article entitled "*Electrical and Structural Studies of Plasma-Polymerized Fluorocarbon Films*" reported by N. Amyot, J. E. Klemberg-Sapieha, and M. R. Wertheimer in *IEEE Transactions on Electrical Insulation*, Vol. 27 No. 6, pp 1101–1107, December 1992. In this study, plasma-polymerized fluorocarbon films up to 8 μm in thickness have been prepared by high frequency glow discharge deposition to investigate the charge storage properties of the material. Yet another instance is an article entitled "*The Properties of Plasma-Polymerized Fluorocarbon Film in Relation to $CH_4/C_4F_8$ Ratio and Substrate Temperature*" reported by Y. Matsumoto, M. Ishida, *Sensors and Actuators A: Physical*, Vol. 83 (1–3) May 22, 2000, pp. 179–185. In this study, plasma polymerized fluorocarbon films have been deposited with a deposition rate as low as few nanometers per minute.

SUMMARY OF THE INVENTION

In accordance with the present invention, there is provided a process for producing a pattern of negative electron beam resist, comprising: depositing a layer of plasma polymerized fluoropolymer on a face of a substrate, the plasma polymerized fluoropolymer forming the negative electron beam resist; producing an electron beam; moving the electron beam on the layer of plasma polymerized fluoropolymer to define the pattern, the layer then having exposed fluoropolymer areas defining the pattern and unexposed fluoropolymer areas; and removing the unexposed fluoropolymer areas to leave only the pattern on the face of the substrate.

The present invention also relates to a process for producing a pattern in a layer of negative electron beam resist, comprising: depositing the layer of negative electron beam resist on a face of a substrate; producing an electron beam; moving the electron beam on the layer of negative electron beam resist to define the pattern, the layer then having exposed resist areas defining the pattern and unexposed resist areas; treating the patterned layer with a base solution to decrease a dry etch resistance of the unexposed resist areas; and dry etching the unexposed resist areas to leave only the pattern on the face of the substrate.

The foregoing an other objects, advantages and features of the present invention will become more apparent upon reading of the following non restrictive description of illustrative embodiments thereof, given by way of example only with reference to the accompanying drawings.

BRIEF DESCRIPTION OF THE DRAWINGS

In the appended drawings:

FIG. 7b is a cross sectional, elevational view of the lithography of FIG. 7a.

DETAILED DESCRIPTION OF THE ILLUSTRATIVE EMBODIMENTS

Figure 1:
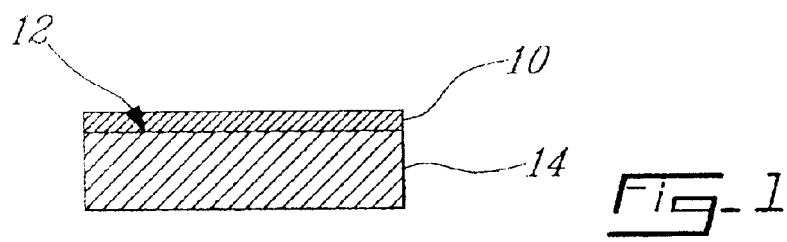
FIG. 1 is a cross sectional, elevational view of a substrate on which a layer (or film) of plasma polymerized negative electron beam resist has been deposited.

With reference to the accompanying drawings, the illustrative embodiments of the present invention will now be described.

The illustrative embodiments of the present invention relate to a process for producing a pattern of plasma polymerized, high-resolution negative electron beam resist having a high sensitivity to electron beam.

Among many other applications, this process can be used in the fabrication of, for example, microcircuits and masks.

FIG. 1

The process first comprises the deposition of a layer 10 of plasma polymerized negative electron beam resist on a face 12 of a substrate 14. The layer 10 of plasma polymerized negative electron beam resist can be deposited under the form of a thin film.

FIG. 2

The layer 10 of plasma polymerized negative electron beam resist is exposed to an electron beam. More specifically, an electron beam 16 is produced and is moved on the layer 10 of plasma polymerized negative electron beam resist to define (or write) a pattern 20.

Figure 2:
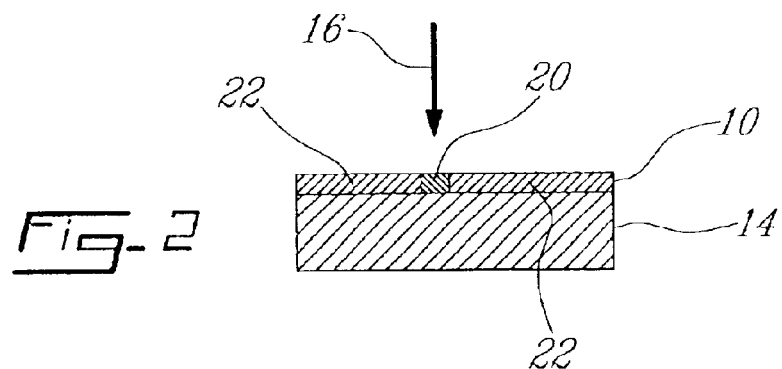
FIG. 2 is a cross sectional, elevational view of the substrate and layer of plasma polymerized negative electron beam resist of FIG. 1, showing exposure of the layer of plasma polymerized negative electron beam resist to an electron beam.
Figure 3:
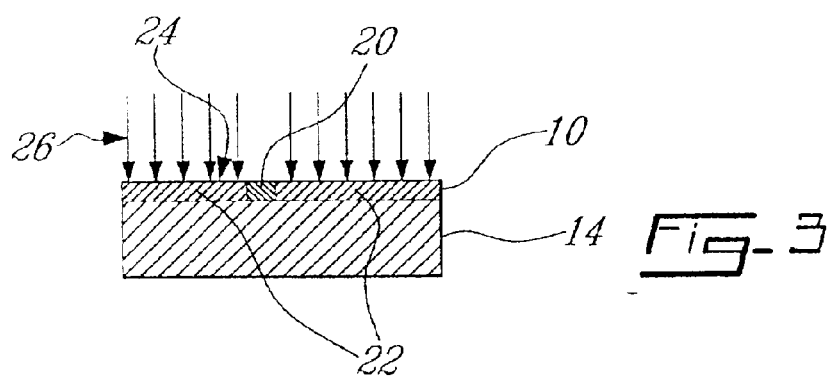
FIG. 3 is a cross sectional, elevational view of the substrate and layer of plasma polymerized negative electron beam resist of FIG. 1, showing a pattern that has been formed in the layer of plasma polymerized negative electron beam resist by means of the electron beam.
Figure 4:
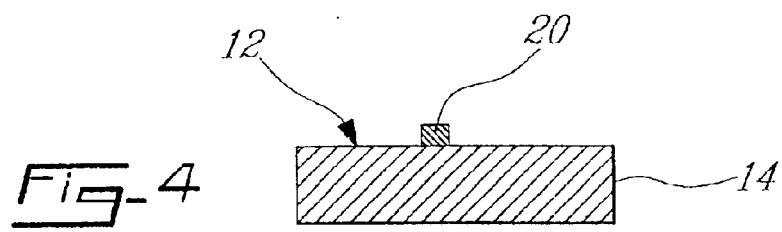
FIG. 4 is a cross sectional, elevational view of the substrate and layer of plasma polymerized negative electron beam resist of FIG. 1, in which the areas of the layer of plasma polymerized negative electron beam resist unexposed to the electron beam have been etched away.

Following exposure to the electron beam 16, the layer 10 comprises exposed resist areas defining the pattern 20 and unexposed resist areas such as 22 (FIGS. 2 and 3).

FIG. 3

According to a non limitative illustrative embodiment, the process may include a treatment of the patterned face 24 of the layer 10 of plasma polymerized negative electron beam resist with a base solution 26 to decrease a dry etch resistance of the unexposed resist areas 22.

FIG. 4

The unexposed resist areas 22 are removed to leave on the face 12 of the substrate 14 only the pattern 20 of plasma polymerized negative electron beam resist.

Plasma polymerized negative electron beam resist is an excellent choice as a replacement to, for example, electron beam spin-coated resists. This resist has, amongst others, the following advantages:

plasma polymerized negative electron beam resists can be prepared by a convenient, plasma polymerization method;

plasma polymerized negative electron beam resist films can be produced with pinhole free surface and precise control of the resist thickness that are appropriate for many applications; and the requirement of first spinning the resist and then hard and soft baking the same is eliminated.

These factors are important for technological scale-up and commercialization of processes using ultra-thin, pinhole free resist.

Keeping the above in the mind, what follows are illustrative embodiment features that can be included, without limitation, in the present invention.

FIG. 1

The layer 10 can be a layer of plasma polymerized fluoropolymer. Such a plasma polymerized negative electron beam fluoropolymer resist constitutes a high-resolution resist and has a high sensitivity to electron beam. Also, the plasma polymerization deposition process yields a continuous layer 10 of plasma polymerized fluoropolymer on the face 12 of the substrate 14; plasma polymerized fluoropolymer resist films can be produced with pinhole free surface and precise control of the resist thickness.

The layer 10 of plasma polymerized fluoropolymer resist can be deposited from a gas selected from the group consisting of $CF_4$, $C_4F_8$, $C_2F_6$, $C_3F_8$, $CHF_3$, $C_2F_4$, $C_3F_6$, fluorine-containing plasma gas, and a combination of any of these gases with another gas such as $H_2$ or Ar. The combination may further include a hydrocarbon gas selected from the group consisting of $CH_4$, $CH_6$, $C_2H_4$, $C_2H_2$, and $C_3H_8$, or any other appropriate hydrocarbon gas.

In a particular illustrative embodiment, the fluoropolymer resist can be plasma modified as described in U.S. Pat. No. 4,946,903 granted to Gardella, Jr. et al on Aug. 7$^{th}$, 1990 and U.S. Pat. No. 5,266,309 (Gardella, Jr. et al) issued on Nov. 30$^{th}$, 1993.

Control of the plasma polymerization conditions to obtain a layer of plasma polymerized negative electron beam resist having the desired thickness is within the ability of one having ordinary skill in the art.

For the purposes of the present invention, what is needed is a layer or film 10 of sufficient thickness that can be patterned in selected areas of the resist. Typically, the resist layer 10 will have a thickness of at least 5 nm; this thickness will depend on the intended application. For example, the negative electron beam resist may be an adherent, uniform, pinhole-free film having a thickness of at least 5 nm.

In principle, any material which does not adversely affect the properties of the resist can be used as the substrate 14. The substrate 14 may present any shape, any size, and any prefabricated relief.

For example, the substrate 14 is made of a material selected from the group consisting of glass, ceramics, plastics, metals such as nickel, semiconductors such as gallium arsenide, gallium antimonide, silicon, silicon nitride, and silicon oxide, and masks blanks. Examples include inorganic substrates such as glass, quartz, silica, silicon, silicon carbide, silicon nitride, alumina, aluminum nitride, chromium, titanium nitride, and diamond, and organic substrates such as polymers, plastics, and waxes.

FIG. 2

According to an illustrative embodiment, beam 16 is a low energy electron beam 16 to form a latent pattern. The patterning operation should also meet with the resolution requirements. Additionally, patterning of the resist must not adversely affect the properties of the underlying substrate 14. Finally, the patterning operation will be simple, reproducible, cost-effective, and compatible with existing manufacturing equipments used in electron beam lithography. This is believed to be within the ability of one of ordinary skill in the art to design an electron beam patterning operation that meets with the above requirements.

FIG. 3

The treatment of the patterned face 24 of the layer 10 with a base solution decreases a dry etch resistance of the unexposed resist areas 22 before removing the unexposed resist areas 22. In the case of plasma polymerized fluoropolymer unexposed resist areas 22 to be dry etched, the base solution used is one that defluorinates these unexposed fluoropolymer areas 22.

FIG. 4

As a non-limitative example, the unexposed resist areas 22 are removed by wet and/or dry etching techniques. Accordingly, the exposed resist areas corresponding to the pattern 20 have to resist the wet and dry etch to reveal the pattern 20 on the surface 12 of the substrate 14.

The wet etching process may include the use of a base solution.

The dry etching process may include the use of an oxygen or oxygen-containing gas plasma etching, or a reactive ion etching. In one illustrative embodiment the dry etching process includes plasma etching with $CF_4$ and $O_2$.

Dry etching of the unexposed resist areas 22 is made easier by the above mentioned treatment of the patterned face 24 of the layer 10 with a base solution to decrease a dry etch resistance of the resist in the unexposed areas 22.

According to a non-limitative embodiment, the present invention provides a process of depositing a resist film of around 200 nm thickness on a nickel surface from a mixture of gases consisting of $CH_4$ and $CF_4$. After exposing the deposited resist film to an electron beam, the patterned resist is then developed in a solution of saturated sodium hydroxide/ethanol for 20 minutes at 60° C., and then is dry etched by plasma etch technique using a combination of $CF_4$ and $O_2$ gases.

The invention will now be further illustrated by the following non-limitative examples:

EXAMPLE 1

Figure 5:
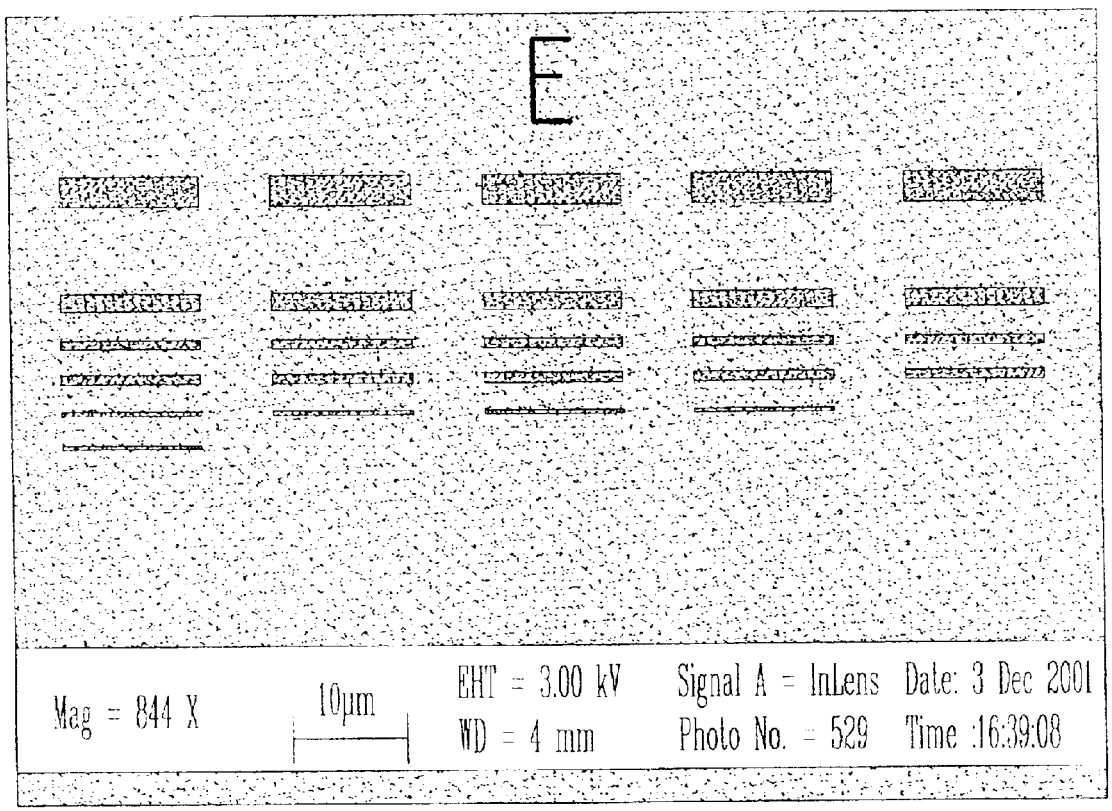
FIG. 5 is a micrograph of a patterned layer of plasma polymerized negative electron beam resist that has been produced through a pattern producing process according to the invention.

Resists for advanced mask-making with electron-beam writing tools have undergone dramatic changes over the last three decades. In this example, the method according to the present invention will be applied to the production of X-ray masks. A $Si_3N_4$ film is deposited on a silicon substrate. In this example, a tantalum absorbent layer is deposited after deposition of an etch stop Cr interlayer. The wafer is then bonded to a support glass ring by anodic bonding. After bonding, a 350 nm thick layer of β-tantalum is deposited by RF sputtering, a 20 nm thin layer of nickel is deposited over the X-ray absorbent β-tantalum layer by sputtering. The nickel is used as a hard etch mask for tantalum. For electron beam lithography, a layer of plasma polymerized electron beam resist is then deposited over the nickel layer. An electron beam writing system is then used to expose a pattern on the resist. The electron beam current is 26 pA and the energy is 3 KeV. The exposure dose is 17 $\mu C/cm^2$. FIG. 5 is an example of micrograph of a patterned layer of plasma polymerized electron beam resist.

Figure 6:
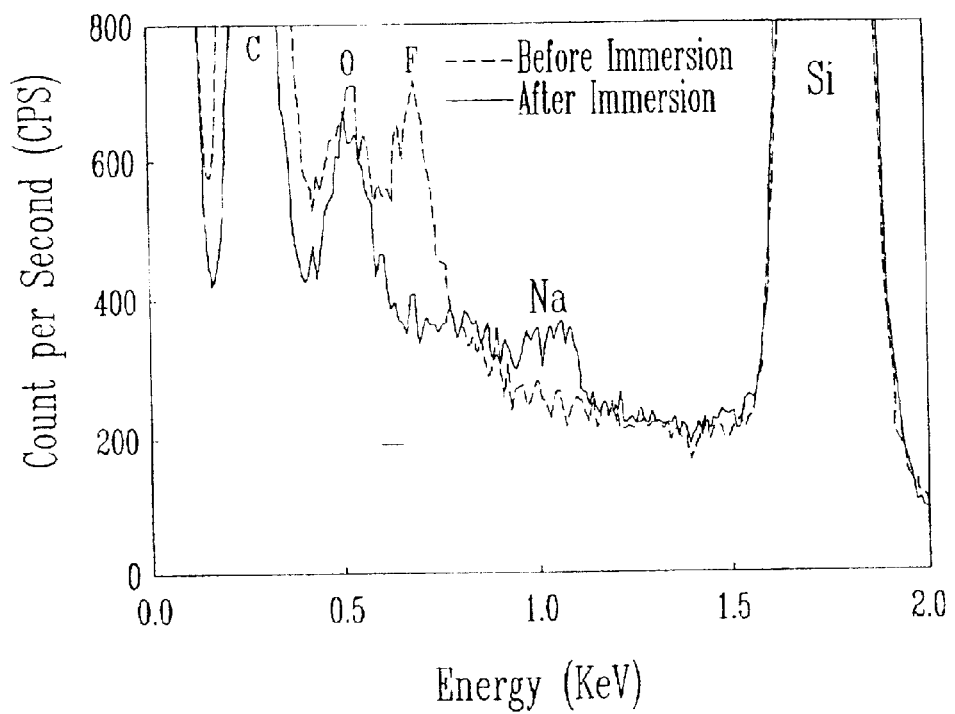
FIG. 6 is a graph of an X-ray analysis of a plasma polymerized negative electron beam resist resist before and after having been immersed in a NaOH/Ethanol saturated solution at 60° C. for 20 minutes.

After exposure, the sample is immersed in NaOH/Ethanol saturated solution for 20 minutes at 60° C. to deflorinate the unexposed areas of the resist. FIG. 6 is a graph of an X-ray analysis of a plasma polymerized negative electron beam resist before and after having been immersed in a NaOH/Ethanol saturated solution at 60° C. for 20 minutes.

Afterward, a $CF_4:O_2$ (1:1) gas mixture is used in a plasma etcher at 200 W for 4 minutes to completely remove the unexposed areas of the resist. The exposed areas resists to the $CF_4: O_2$ plasma. Once the resist pattern is formed, the unpatterned nickel is wet etched using a $HNO_3:CH_3CHOHCH_3:H_2O$ (1:4:400) solution. The pattern is transferred to the tantalum absorber using a $SF_6: CH_4$ mixture in RIE (Reactive Ionic Etching).

EXAMPLE 2

Figure 7A:
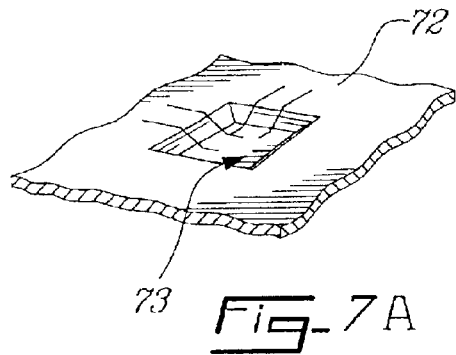
FIG. 7a is a perspective view of a lithography made using the pattern producing method according to the invention on three-dimensional structures.
Figure 7B:
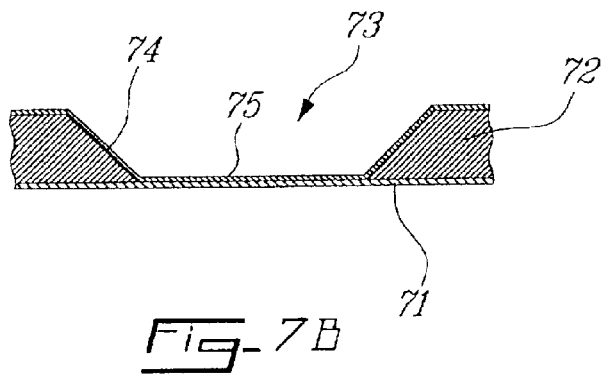

The plasma polymerized negative electron beam resist can be used in buildup of a multilayered structure as shown in FIGS. 7a and 7b. Plasma polymerized electron beam resist can be applied to three-dimensional structures of surfaces having a high relief. The lithography process on three-dimensional structures having a height difference of several hundred of micrometers suffer from several restrictions such as level planarization and defect free resist. Plasma polymerized electron beam resist allows to eliminate the planarization process and results in defect free resist. The three dimensional lithography can be done by depositing a membrane 71 on a silicon wafer 72, a window 73 can be opened on the back of the silicon wafer by etching silicon using KOH, leaving the membrane 71 as a base for the three-dimensional structures.

The membrane 71 can be $Si_3N_4$, SiC, or diamond. A conductive metal layer 74 such as Cu or Al can be deposited on the wafer followed by deposition of plasma polymerized electron beam resist 75. A scanning electron microscope can be used to write lines on the resist 75. These lines are then transferred by etching to the metal layer 74 to form on the bulk silicon, the membrane and the inclined planes metal connections between the two level structures. These lines can make a connection between fabricated devices and sensors on the membrane 71 by the other structures on the bulk silicon. An innovative technology with a dry film resist for use in microsystem engineering applications can be achieved using plasma polymerized electron beam resist.

EXAMPLE 3

Plasma polymerized electron beam resist can be used in fabrication of a tip on top of a glass fiber. A thin chromium layer can be deposited on the fiber tip followed by deposition of plasma polymerized electron beam resist. The use of a dry resist enables the deposition of a uniform layer on a very small area without any restriction of the substrate size or shape. Such a task is very difficult to accomplish with the use of wet resists, which require spinning techniques that should also be very difficult to use in the specific case of the end of an optical fiber. An electron beam writer can be used to define a pattern in the resist layer. The pattern can be transferred to the metallic film underneath by wet and or dry etching. The chromium film acts as a mask, which can be used to perform the etching of the fiber. The shape of the final fiber tips can vary depending on the intended application.

It is to be understood that the invention is not limited in its application to the details of construction and parts illustrated in the accompanying drawings and described hereinabove. The invention is capable of other embodiments and of being practised in various ways. It is also to be understood that the phraseology or terminology used herein is for the purpose of description and not limitation. Hence, although the present invention has been described hereinabove by way of preferred embodiments thereof, it can be modified, without departing from the spirit, scope and nature of the subject invention as defined in the appended claims.

What is claimed is:

1. A process for producing a pattern of negative electron beam resist, comprising:
   (a) depositing a layer of plasma polymerized fluoropolymer on a face of a substrate, the plasma polymerized fluoropolymer forming the negative electron beam resist;
   (b) producing an electron beam;
   (c) moving the electron beam on the layer of plasma polymerized fluoropolymer to define the pattern, the layer then having exposed fluoropolymer areas defining the pattern and unexposed fluoropolymer areas; and
   (d) removing the unexposed fluoropolymer areas to leave only the pattern on the face of the substrate;
   wherein the process for producing a pattern of negative electron beam resist further comprises, prior to (d), treating the patterned layer with a base solution to defluorinate the unexposed fluoropolymer areas.

2. The process according to claim 1, wherein the layer of plasma polymerized fluoropolymer constitutes a pinhole free thin resist film.

3. The process according to claim 2, wherein the pinhole free thin resist film includes an adherent uniform film having a thickness of at least 5 nm.

4. The process according to claim 1, wherein the layer of plasma polymerized fluoropolymer has a thickness of at least 5 nm.

5. The process according to claim 1, wherein removing the unexposed fluoropolymer areas comprises using a technique selected from the group consisting of wet etching, dry etching, and a combination thereof.

6. The process according to claim 5, wherein said dry etching comprises plasma etching using $CF_4$ and $O_2$ gases to etch the unexposed fluoropolymer areas.

7. The process according to claim 1, wherein (a) comprises depositing the layer of plasma polymerized fluoropolymer from a gas selected from the group consisting of $CF_4$, $C_4F_8$, $C_2F_6$, $C_3F_8$, $CHF_3$, $C_2F_4$, $C_3F_6$, fluorine-containing plasma gas, and a combination of any of the foregoing with another gas.

8. The process according to claim 7, wherein said other gas is selected from the group consisting of $H_2$ and Ar.

9. The process according to claim 8, wherein said combination further includes a hydrocarbon gas.

10. The process according to claim 9, wherein said hydrocarbon gas is selected from the group consisting of $CH_4$, $C_2H_6$, $C_2H_4$, $C_2H_2$ and $C_3H_8$.

11. The process according to claim 1, wherein the substrate is selected from the group consisting of inorganic and organic substrates.

12. The process according to claim 11, wherein the inorganic substrate is selected from the group consisting of glass, metal, ceramic, chromium, titanium nitride, diamond, semiconductor and mask blanks.

13. The process according to claim 12, wherein the metal comprises nickel.

14. The process according to claim 12, wherein the semiconductor is selected from the group consisting of gallium arsenide, gallium antimonide, quartz, silica, silicon, silicon carbide, silicon nitride and silicon oxide.

15. The process according to claim 11, wherein the organic substrate is selected from the group consisting of polymers, plastics, and waxes.

16. A process for producing a pattern of negative electron beam resist, comprising:
    (a) depositing a layer of plasma polymerized fluoropolymer on a face of a substrate, the plasma polymerized fluoropolymer forming the negative electron beam resist;
    (b) producing an electron beam;
    (c) moving the electron beam on the layer of plasma polymerized fluoropolymer to define the pattern, the layer then having exposed fluoropolymer areas defining the pattern and unexposed fluoropolymer areas; and
    (d) removing the unexposed fluoropolymer areas to leave only the pattern on the face of the substrate;
    wherein:
    removing the unexposed fluoropolymer areas includes dry etching said unexposed fluoropolymer areas; and said process further comprises, prior to (d), treating the patterned layer with a base solution to decrease a dry etch resistance of the unexposed fluoropolymer areas.

17. The process according to claim 16, wherein the layer of plasma polymerized fluoropolymer constitutes a pinhole free thin resist film.

18. The process according to claim 16, wherein the layer of plasma polymerized fluoropolymer has a thickness of at least 5 nm.

19. The process according to claim 16, wherein said dry etching comprises plasma etching using $CF_4$ and $O_2$ gases to etch the unexposed fluoropolymer areas.

20. The process according to claim 16, wherein (a) comprises depositing the layer of plasma polymerized fluororopolymer from a gas selected from the group consisting of $CF_4$, $C_4F_8$, $C_2F_6$, $C_3F_8$, $CHF_3$, $C_2F_4$, $C_3F_6$, fluorine-containing plasma gas, and a combination of any of the foregoing with another gas.

21. The process according to claim 20, wherein said other gas is selected from the group consisting of $H_2$ and Ar.

22. The process according to claim 21, wherein said combination further includes a hydrocarbon gas.

23. The process according to claim 22, wherein said hydrocarbon gas is selected from the group consisting of $CH_4$, $C_2H_6$, $C_2H_4$, $C_2H_2$, and $C_3H_8$.

24. The process according to claim 16, wherein the substrate is selected from the group consisting of inorganic and organic substrates.

25. The process according to claim 24, wherein the inorganic substrate is selected from the group consisting of glass, metal, ceramic, chromium, titanium nitride, diamond, semiconductor and mask blanks.

26. The process according to claim 24, wherein the organic substrate is selected from the group consisting of polymers, plastics, and waxes.

27. A process for producing a pattern in a layer of negative electron beam resist, comprising:

(a) depositing the layer of negative electron beam resist on a face of a substrate;

(b) producing an electron beam;

(c) moving the electron beam on the layer of negative electron beam resist to define the pattern, the layer then having exposed resist areas defining the pattern and unexposed resist areas;

(d) treating the patterned layer with a base solution to decrease a dry etch resistance of the unexposed resist areas; and (e) dry etching the unexposed resist areas to leave only the pattern on the face of the substrate.

28. The process according to claim 27, wherein the negative electron beam resist is a plasma polymerized fluoropolymer resist.

29. The process according to claim 28, wherein the base solution has a composition which defluorinates the unexposed resist areas.

* * * * *